US006307753B1

(12) United States Patent
Baginy et al.

(10) Patent No.: US 6,307,753 B1
(45) Date of Patent: Oct. 23, 2001

(54) CONNECTION ASSEMBLY OF PRINTED-CIRCUIT BOARD AND CONNECTOR AND AN ELECTRONIC-EQUIPMENT PLUG-IN CARD PROVIDED WITH SAME

(75) Inventors: Michael Duane Baginy, Winnenden (DE); Iain Thomas Learmonth, Basingstoke (GB); Sepp-Dieter Michaelis, Aalen; Werner Biermann, Winterbach, both of (DE)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 08/633,667

(22) Filed: Apr. 17, 1996

(30) Foreign Application Priority Data

Apr. 20, 1995 (DE) .................................. 195 14 121
Oct. 31, 1995 (DE) .................................. 195 40 540

(51) Int. Cl.[7] .............................. H01K 1/18; H01R 12/18
(52) U.S. Cl. ......................... 361/796; 361/737; 361/767; 361/807; 439/566
(58) Field of Search ................................... 361/736, 737, 361/728, 767, 807, 810, 796; 439/74, 95, 108, 566, 571, 572, 931; 174/261

(56) References Cited

U.S. PATENT DOCUMENTS 4,423,467   12/1983   Shaheen .
4,628,410   12/1986   Goodman .
4,991,666 * 2/1991   Septfons et al. ..................... 174/261
5,477,421   12/1995   Bethurum ............................. 361/818
5,477,426   12/1995   Bethurum ............................. 361/737
5,481,434    1/1996   Banakis et al. ...................... 361/356
5,547,384 * 8/1996   Benjamin .............................. 439/79
5,713,126 * 2/1998   Sakemi ................................. 29/843

FOREIGN PATENT DOCUMENTS 2 404 991   4/1979   (FR) .

OTHER PUBLICATIONS

"StarCard II PCMCIA I/O Card Kit"; ITT Cannon Sales Catalog; (no date).

* cited by examiner

Primary Examiner—Jayprakash N. Gandhi
(74) Attorney, Agent, or Firm—Roger C. Turner

(57) ABSTRACT

In a connection assembly (15) of printed-circuit board and connector, a printed-circuit board (16) and a connector (17) can be fixed positionally accurately in relation to one another by means of position holders (36, 37) provided on the connector (17). The position holders are constituted of soldering pins (36, 37) and the printed-circuit board (16) is provided with soldering pads (46, 47) which can be connected to the opposing soldering pins (36, 37) by soldering. There is provided in this manner a connection assembly (15) of printed-circuit board and connector in which the positionally accurate fixing of a printed-circuit board (16) and a connector (17) is more easily produced and more precisely assembled than has been possible to date.

13 Claims, 4 Drawing Sheets

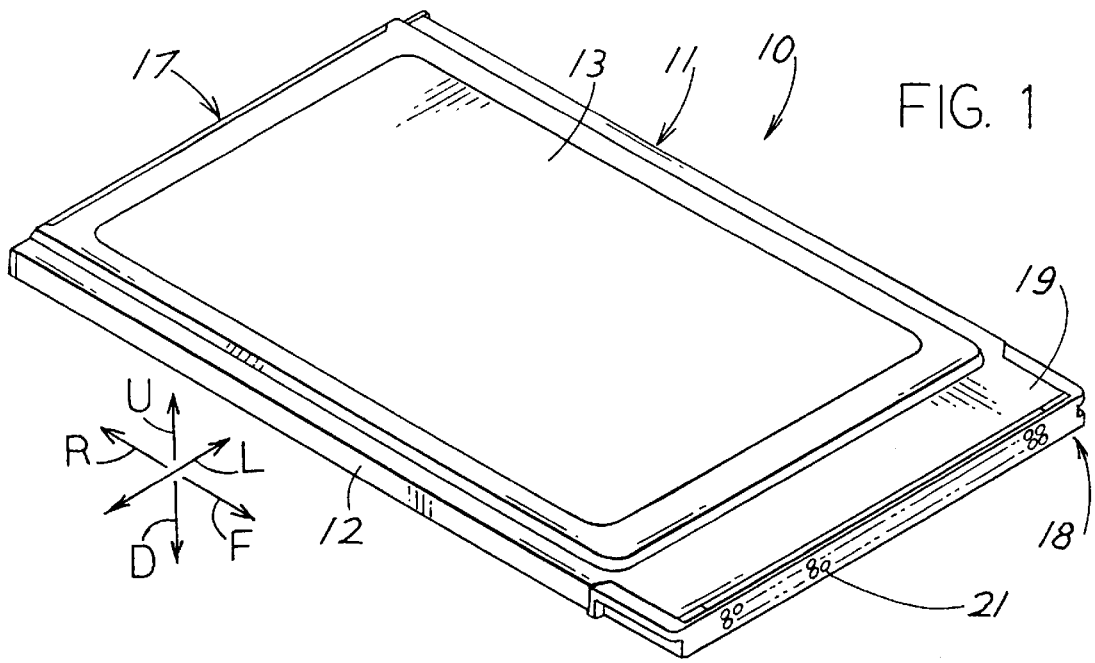
FIG. 1
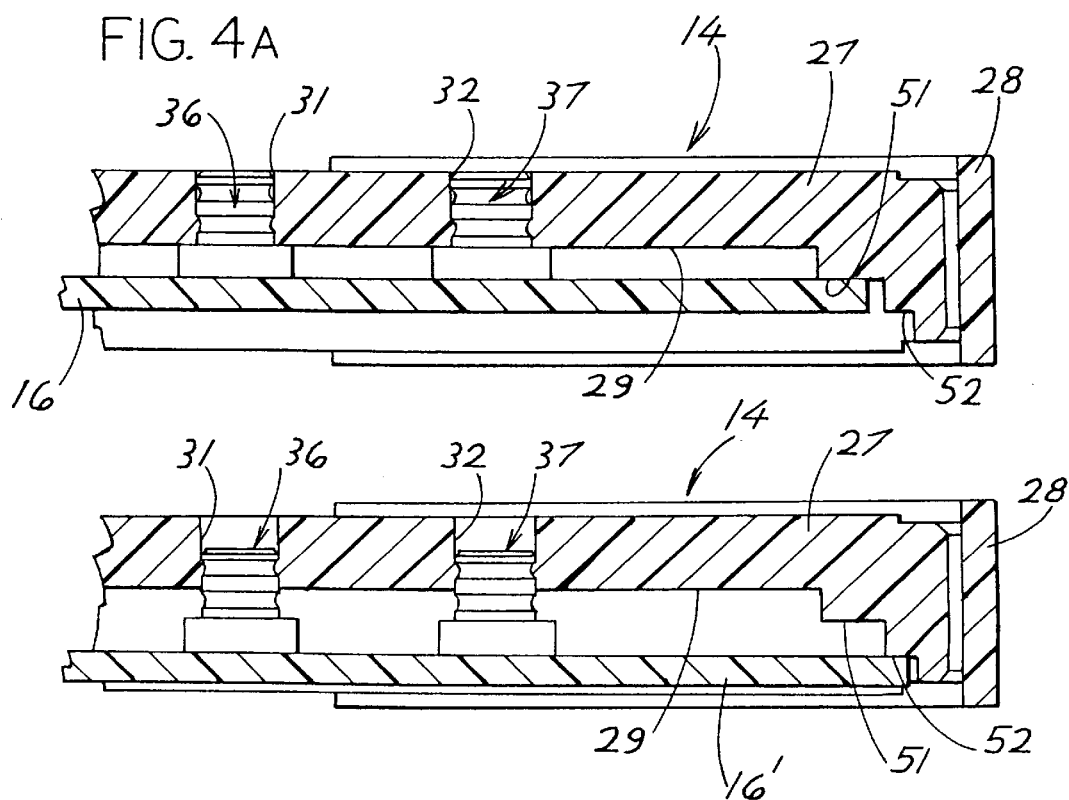
FIG. 4A
FIG. 4B

CONNECTION ASSEMBLY OF PRINTED-CIRCUIT BOARD AND CONNECTOR AND AN ELECTRONIC-EQUIPMENT PLUG-IN CARD PROVIDED WITH SAME

CROSS REFERENCE

Applicant claims priority from German patent application 19514121.0 filed Aug. 20, 1995 and German patent application 19540540.4 filed Oct. 31, 1995.

BACKGROUND OF THE INVENTION

The present invention relates to a connection assembly and to an electronic-equipment plug-in card provided with same.

The connection of a printed-circuit board and a connector necessitates accurate positioning of the two components in relation to one another, because on account of the general confined basic connection grid, the connecting lugs of the connector must coincided precisely in position with the connecting tracks of the printed-circuit board for soldering purposes. To date, this positionally accurate fixing of the connector on the printed-circuit board or vice versa is produced by moulding pegs onto the connector as position holders, which pegs can be plugged into locating holes in the appropriate areas of the printed-circuit board. Connectors referred to as MPC connectors can be considered known in this context.

This manner of holding or positionally fixing a printed-circuit board and connector relatively to one another prior to production of the soldered connection is relatively time-consuming and costly in terms of preparing for production and relatively imprecise with regard to contact positioning between the printed-circuit board terminal contact tracks and the connecting lugs of the connector.

Plug-in cards having such a connection are also known, for example of the kind supplied as memory cards, modem cards, fax cards or the like in PCMCIA Standard. Such plug-in cards have a plastic frame on which one or two connectors are fastened and within which the printed-circuit board inserted with electronic components mounted thereon is arranged and retained in a specifically predetermined position in the above-mentioned manner. Metal covers are attached to both sides of the plastic frame equipped in this way.

SUMMARY OF THE INVENTION

The problem addressed by the present invention is to create a connection of a printed-circuit board and connector with an electronic-equipment plug-in card provided with same, each of the kind mentioned at the outset, in which the possibility accurate fixing of printed-circuit board and connector can be more easily produced and more precisely assembled.

The measures in accordance with the invention avoid the relatively imprecise and nonetheless complicated provision of location holes or punched holes in the printed-circuit board. In contrast with the foregoing, the printed-circuit board is provided with soldering track areas or soldering pads which can be more accurately dimensioned and positioned. This facilitates a more positionally accurate relative location of printed-circuit board and connector, because when soldering pads of the printed-circuit board to the soldering pins which are fixed to the spacing element, the printed-circuit board floats of itself, on the fluid solder between the areas to be soldered, precisely into the correct, prescribed position. Moreover, it is easier and less expensive to attach soldering pads to a printed-circuit board than to place accurately positioned drilled holes in the printed-circuit board.

In the aforementioned plug-in cards, it has been proposed, in order to utilize the free space between the enclosed parts in printed-circuit boards with differently sized components, that beginning from one support area on the connector or spacer, the position holders or pegs be provided in gradually smaller diameters, so as to produce annular support areas for the printed-circuit boards, arranged in several levels at a distance from one another. For this purpose, the relevant areas of the printed-circuit board are provided with locating holes whose diameters differ as a function of the printed-circuit board used or inserted and therefore as a function of the desired position in the plug-in card. This means that a printed-circuit board provided with full diameter-size holes is penetrated by the entire peg, so that printed-circuit board takes up the lowest possible level in the plug-in card and that a printed-circuit board provided with the envisaged smallest-diameter holes will lie on the uppermost annular support area of the peg and thus take up the uppermost possible level. One or more intermediate sizes of hole can be provided together with intermediate layers of printed-circuit boards. The invention makes it possible to combine the connection of printed-circuit board and connector based on soldering pads with the option of arrangement in different levels.

The soldering pins can be made of an appropriate metal. Alternatively, however, in accordance with the invention, the soldering pins are made of plastic and imprinted with a soldering pad.

In a preferred embodiment of the present invention, the soldering pins can be connected to latch with the connector. This can be done by means of a simple plug-in connection.

The soldering pins can, for example, be designed in different lengths to obtain the different heights or levels. In accordance with a further embodiment of the present invention, however, the soldering pins are provided with several latching elements arranged at a distance, so the identically designed soldering pins can be used in all cases, being simply latched at different spacings onto or into the connector.

For example, the soldering pins can be latched as hollow pins onto corresponding pegs on the spacing element. However, the invention provides that the soldering pins be fitted to plug into latching holes in the spacing elements.

In addition to the supporting points with the soldering pins provide for the printed-circuit board, a plug-in card can be provided, in accordance with the invention, with additional support steps on the spacing elements for end tabs on the printed-circuit board.

Further details of the invention are provided in the description that follows, in which the invention is described and explained in greater detail with reference to the embodiments presented in the drawings.

BRIEF DESCRIPTION OF THE DRAWINGS

FIG. 1 is a diagrammatic perspective view of a plug-in card using a connection assembly of printed-circuit board and connector in accordance with a preferred embodiment of the present invention.

FIGS. 4A and 4B is a section corresponding to FIG. 3A, but in assembled condition with printed-circuit boards retained at different levels within the plug-in card.

DETAILED DESCRIPTION OF THE INVENTION

Figure 2A:
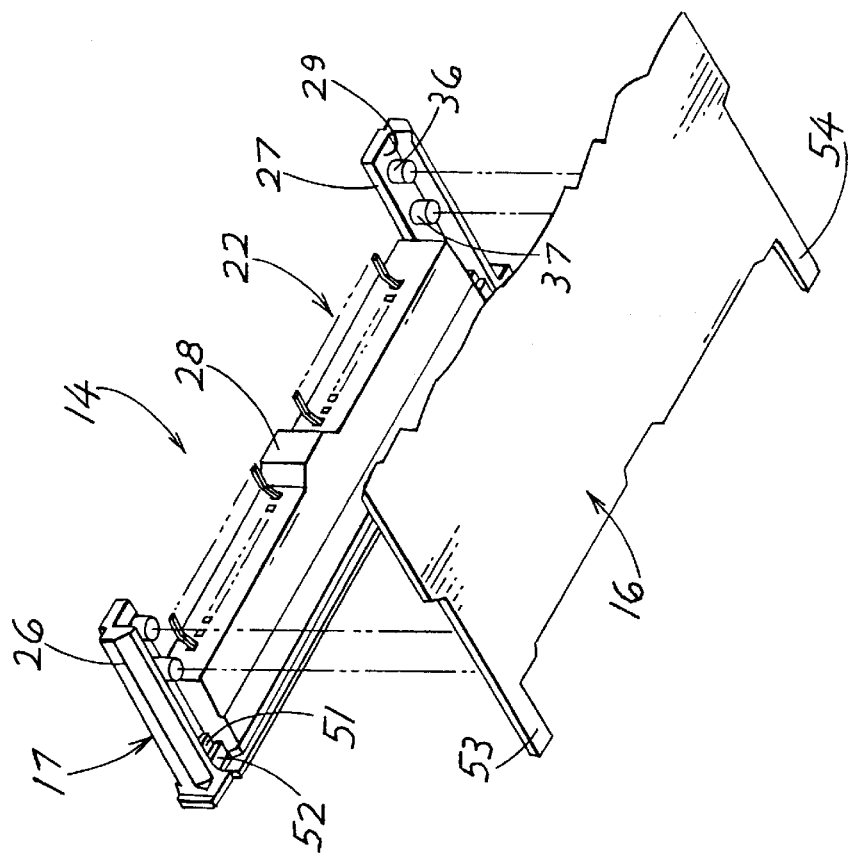
FIGS. 2A and 2B are partially truncated perspective views of an end section of the print-circuit board in FIG. 1, but without enclosure, viewed diagonally from above and below respectively.

The frameless electronic-equipment plug-in card 10 which is shown in assembled condition in FIG. 1, has front and rear ends spaced in directions F, R, has laterally opposite sides spaced in lateral directions L, and has upper and lower portions spaced in directions U, D. The card has an elongated, rectangular, very flat enclosure 11, which is comprised of a recessed bottom enclosure section 12 and a recessed top enclosure section 13 connected to latch with the former. Front and rear spacers, or connectors 18, 17 lie at the ends of the cards. Between the two enclosure sections 12 and 13 there is arranged and fixed in place a unit 14 (FIG. 2A) only partially represented in each case, which has an approximately elongated, rectangular printed-circuit board 16 fitted, although this is not illustrated, with electronic components and two spacers 17 and 18 arranged one at each transverse end of the printed-circuit board 16 and connected to same, both of which are designed as connectors. The two connectors 17 and 18 of plug-in card 10 are accessible from outside, connector 17 being designed, for example, to accommodate a cable plug. The front end 19 (FIG. 1) of the plug-in card 10 is provided with the connector 18 which also constitutes a plug-in end for an electronic device. The two connectors 17 and 18 each have a moulded insulated body 20 in whose transverse web 28 (FIG. 2A) there is provided a socket arrangement 21 in a manner not shown in further detail. Each of the connectors is provided with a connecting lug arrangement or contact tails 22 which are arranged in a laterally-extending (L) row. With unit 14 in assembled condition, the connecting lug arrangement 22 is connected, for instance by a soldering operation, to terminal contacts or traces 23 on the printed-circuit board 16.

The intention is to enable printed-circuit boards 16 fitted with different components, and thus having different overall height on at least one side, to be accommodated in the correct position within the plug-in card 10. Several locating positions are provided for this purpose, each for a particular printed-circuit board 16, at different levels within the plug-in card 10.

Figure 3B:
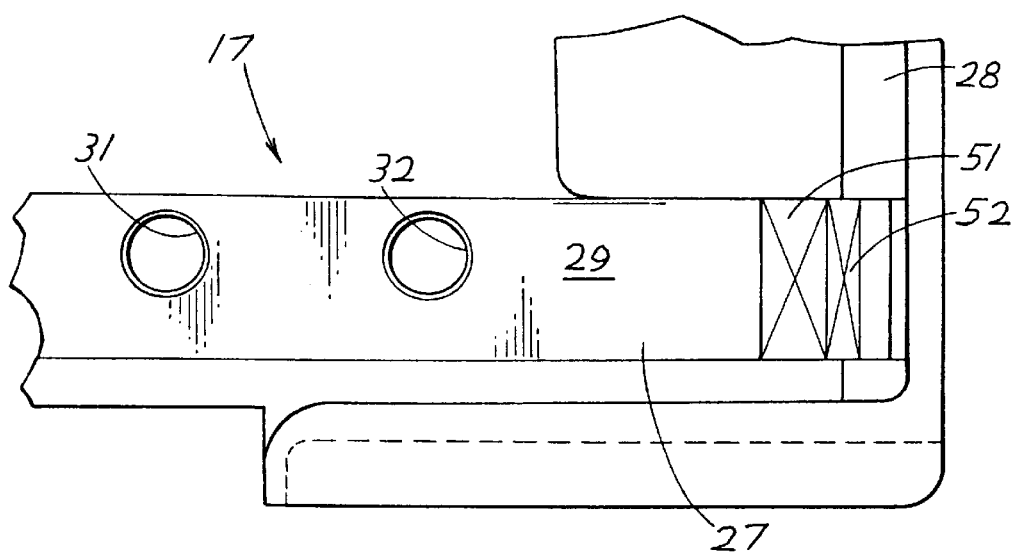
FIGS. 3A and 3B are respectively a section along Line IIIA—IIIA in FIG. 2A showing an exploded view of the individual parts and a view from below corresponding to Arrow IIIB in FIG. 3A.
Figure 3A:
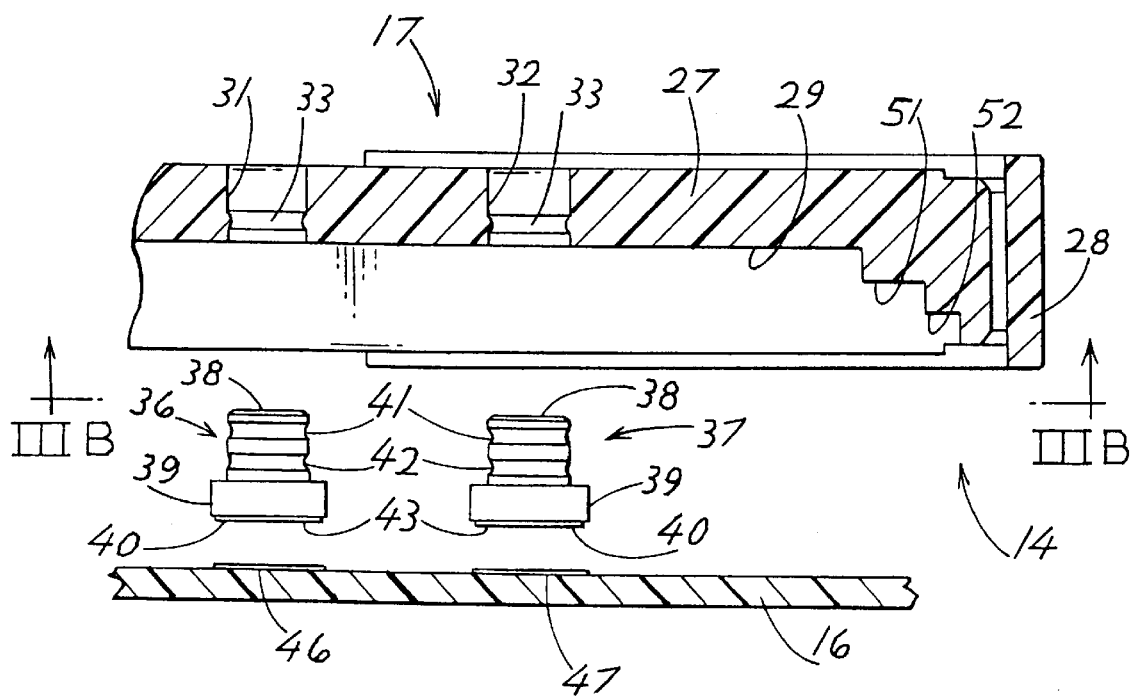

As shown in FIGS. 3A and 3B, each of the spacers 17 and 18 designed as connector has, as shown here only with reference to spacer 17, lateral longitudinal webs 26 and 27 which protrude beyond the depth of the transverse web 28 provided with the socket arrangement 21 and the connecting lug arrangement 22. The two longitudinal webs 26 and 27 have locating holes 31 and 32 in an inside area and at a distance from one another, each provided, in an area facing the underside 29 of the longitudinal webs 26, 27, with a moulded, inwardly-protruding and therefore diameter-reducing annular bead 33 which has a convex cross-section.

As shown in FIG. 3A, identically designed soldering pins 36 and 37 are further provided to produce the connection assembly 15, each having an integrally formed shank 38 and a larger-diameter, flat, disk-type head 39. The shank 38 is provided with several, for example two, annular notches 41 and 42 arranged axially spaced apart from one another, each of them having a concave cross-section. The diameter of the shank 38 and the formation of the annular notches 41 and 42 is such that the shank 38 of the soldering pins 36 and 37 is adapted to latch into the respective locating hole 31 or 32 of the connector 17, 18. The annular bead 33 herein constitutes the one latching element, while any one of the annular notches 41, 42 constitutes the other latching element. In the embodiment represented, either the annular notch 41 leading in the plug-in direction or the annular notch 42 trailing in the plug-in direction can latch with the annular bead 33, so that the head 39 of the soldering pin 36, 37 is at a different, prescribed distance from the underside 29 of the longitudinal webs 26, 27 of the connector 17, 18. When the soldering pin 36, 37 is comprised of a plastic, the head 39 is provided, on its fore-part 43 facing away from the shank 38, with a soldering pad 40 which is preferably located with its entire surface on the fore-part 43.

Apart from the terminal contacts 23 and the unillustrated soldering tracks for the components in question, the printed-circuit board 16 is further provided, on its surface facing the underside 29 of the connector 17, 18, with soldering pads 46, 47, these being arranged at positions which, in assembled condition, lie opposite the fore-part 43 of the head 39 of the soldering pins 36, 37 and their soldering pads 40. A pair of solder pads 46, 47 lies at each laterally (L) opposite side portion of the circuit board, while a pair of solder pins 36, 37 and their solder pin heads with solderable pin head areas lie at each laterally opposite side portion of the connector.

As shown in FIGS. 4A and 4B, a printed-circuit board 16 or 16' can be retained at connectors 17, 18 at different levels within the plug-in card 10. FIG. 4A shows an arrangement of the printed-circuit board 16 adjacent to the underside 29 of connector 17, 18. This arrangement is obtained by plugging the soldering pins 36, 37 entirely into the locating hole 31, 32, in which position the annular notch 42, trailing in the plug-in direction, of the soldering pins 36, 37 latches with the annular bead 33 of the location holes 31, 32. The printed-circuit board 16 is put in place in this latched position of the soldering pins 36, 37, the soldering pads 46, 47 on the printed-circuit board 16 being solder-connected to the soldering pad 40 of the head 39 of the soldering pins 36, 37 by a soldering operation, with the aid of which further soldered connections can be made. The solder liquefied between the opposing solder pads 46, 47 and 40 causes the printed-circuit board 16 as it were to float into the correct position of the soldering pins 36, 37 retained in connectors 17, 18.

The same applies to the position of a printed-circuit board 16' further removed from the underside 29 of the connector 17, 18, obtained by latching the annular notch 41, leading in the plug-in direction, of the soldering pins 36, 37 with the annular bead 33 of the locating holes 31, 32. The printed-circuit board 16 is solder-connected to the soldering pins 36, 37 in the manner described above.

It is to be understood that the soldering pin or pins 36, 37 can have more than two latching elements, i.e. axially spaced annular notches. It is also to be understood that the soldering pins 36, 37 can be comprised of a metal suitable for the soldering operation. Furthermore, it is also possible to arrange more than a printed-circuit board 16, 16' within the plug-in card 10 in this manner.

Figure 2B:
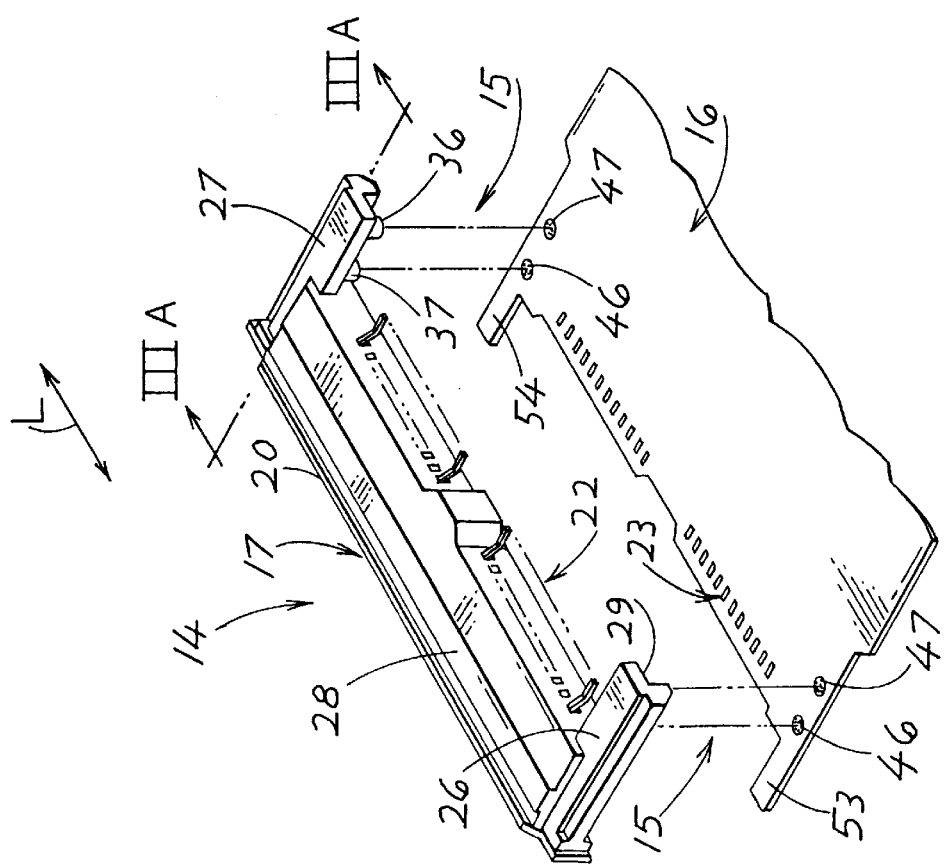

As shown in FIG. 2B, to provide further support for the printed-circuit board 16 on the connectors such as 17, the connectors are provided, as shown in the drawing, at areas of the longitudinal webs 26, 27 adjacent to the transverse web 28, with stair-like steps 51, 52, which are located in flush alignment with the leading part 43 of the soldering pins 36, 37 in one of the two latching positions and on which lie lateral strip-type extensions 53 and 54 of printed-circuit boards 16 and 16' respectively. Depending on the chosen position of printed-circuit board 16, 16' within the plug-in card 10, the extensions 53, 54 of the printed-circuit board 16, 16' are matched in length to the step 51, 52 in question. It is to be understood that the number of steps 51, 52 is matched to the number of latching or annular notches 41, 42 in the soldering pins 36, 37.

Figure 5:
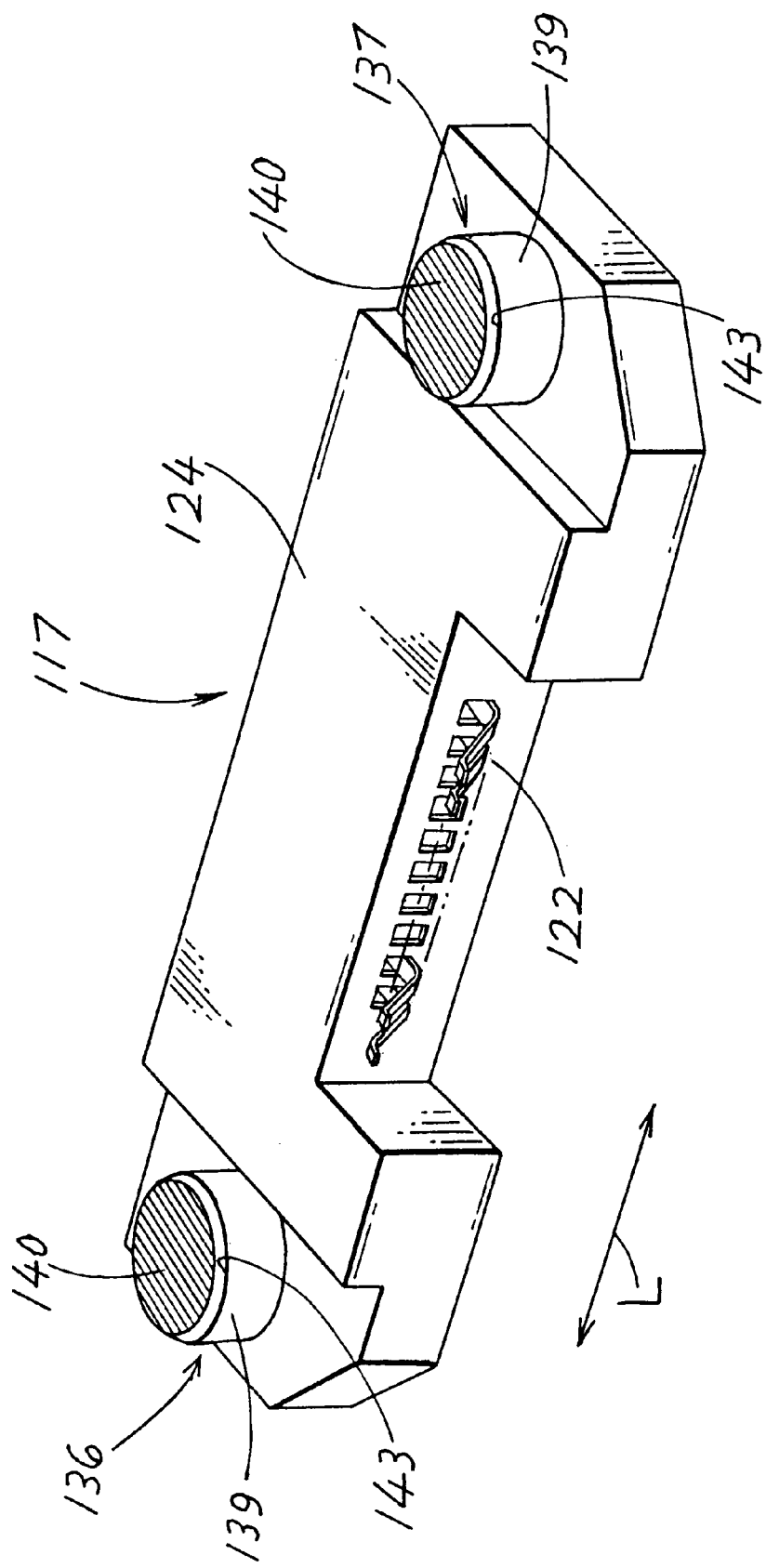
FIG. 5 is a perspective view from underneath of a connector for a connection to a printed-circuit board in accordance wit another embodiment of the present invention.

FIG. 5 shows a connector 117, which can be connected over connection assembly 15 to a printed-circuit board not shown in this illustration in the manner represented in FIGS. 1 to 4 with reference to the first embodiment. The connector 117, which is provided with a connecting lug arrangement 122 projecting beyond the underside 124 of the connector 117 and is to be connected in the manner described above by soldering to the connecting tracks on a printed-circuit board, is fitted at each of the two sides of the connecting lug arrangement 122 with a soldering pin 136 and 137, of each of which only the flat, disk-type head 139 can be seen, on whose leading part 143 a soldering pad 140 is located preferably over the whole surface. It can be seen in FIG. 5 that the lateral (in direction L) width of each pin head at its solder pad or solderable pin head area 140, is a plurality of times greater than the lateral width of each contact tail 122. Opposite these soldering pads 140 of the connector 117 are arranged soldering pads at positions on a printed-circuit board which correspond, in assembled condition, to the position of the leading part 143 of the head 139 of the two soldering pins 136 and 137, as has been described in FIGS. 1 to 4 with reference to the first embodiment. It is to be understood that the leading parts 143 of the soldering pins 136 and 137 protrude above the underside 124 of the connector 117 in a manner corresponding to the position of the connecting lug arrangement 122 and that, as shown in FIG. 5, the connecting lug arrangement 122 and the leading parts 143 or soldering pads 140 of the soldering pins 136 and 137 are arranged at essentially the same level above the underside 124 of the spacer 117.

It is also possible, in keeping with the embodiment in FIGS. 1 to 4, for a connector 117 of this kind, designed in the present case as a so-called MPC connector, to be provided with the soldering pins 136 and 137 capable of latching to connect with the connector 117 at different heights. Also as in the first embodiment, more than one soldering pin 136 and 137 can be provided on each side of the connector 117.

It is to be understood that other types of connector can also be fixed positionally accurately to a printed-circuit board by a connection assembly 15 of this kind in accordance with the invention.

What is claimed is:

1. A plurality of card components that can be assembled into a plug-in card which has front and rear ends, comprising an enclosure, a circuit board having laterally spaced opposite side portions for lying within said enclosure, and a front connector which has laterally spaced opposite side portions and a plurality of contacts having a laterally-extending row of contact tails, wherein said circuit board has a front end with a laterally-extending row of traces that are positioned so each of said contact tails can be soldered to a corresponding one of said traces, including:

at least two solder pin heads on said laterally opposite side portions of said front connector, with each solder pin head having a solderable pin head area of solderable material;

a pair of solder pads on said laterally opposite side portions of said circuit board, said solder pads being positioned so said solderable pin head areas lie on said solder pads when said contact tails rest on said traces, with said solderable pin head areas being laterally shiftable on said solder pads when molten solder lies between them, to enable lateral shifting of said circuit board front portion to precisely align said contact tails with said traces prior to completion of soldering said pin heads to said solder pads.

2. The plurality of card components described in claim 1 wherein:

each of said contact tails has a predetermined lateral width, and said solderable pin head areas each has a lateral width that is a plurality of times greater than the lateral width of each of said tails.

3. The plurality of card components described in claim 2 wherein:

each of said pin heads is substantially flat, to enable it to float on molten solder.

4. A plug-in card connector constructed for mounting on a circuit board that has a face, comprising:

a molded plastic connector body having laterally spaced side portions and at least one row of contacts mounted on said body with said contacts having at least one laterally-extending row of flexible contact tails for solder connection to traces on the circuit board;

a pair of solder heads and means for fixing said solder heads to said laterally spaced portions of said connector body, each solder head having a substantially flat solderable head area positioned to engage a face of the circuit board when said contact tails engage the same face of the circuit board, and with each of said solderable head areas having a lateral width that is at least twice the lateral width of each of said contact tails.

5. The connector described in claim 4 including:

a pair of solder pins that are separate from said connector body, said connector body having holes and said solder pins having shanks that are press-fit receivable in said holes, with each solder pin forming one of said solder heads wherein each solder head lies at an end of the shank of the pin.

6. A method for mounting a connector that has at least one row of contacts that include a laterally-extending row of contact tails, on a circuit board that has a laterally-extending row of traces, with the traces being precisely spaced so each tail can engage and be soldered to a selected one of said traces, comprising:

establishing at least two solder pin heads that each has a solderable pin head area, at laterally spaced locations on said connector, and establishing at least two solder pads on said circuit board at locations to engage said pin head areas when said tails engage said traces;

placing said connector on said circuit board with said tails engaging said traces and said solderable pin head areas engaging said solder pads, establishing molten solder at said locations of engagement including floating said solderable pin head areas on said solder pads on molten solder, and laterally positioning said connector so said tails are precisely aligned with said traces.

7. The method described in claim 6 wherein said connector includes molded plastic with said contacts molded in place therein, and wherein:

said step of establishing at least two solder pin heads includes forming said connector with holes, and installing pins with said pin heads thereon and with metal at least at said solderable pin head areas, and with shanks, by pressing said shanks into said holes.

8. A connection assembly in which a printed-circuit board and a connector can be fixed positionally accurately in relation to one another by means of a position holder, wherein:

said position holder comprises soldering pins and said printed-circuit board has soldering pads provided on it which can be connected to the opposing soldering pins by soldering;

said soldering pins are made of plastic with a soldering pad printed thereon.

9. A connection assembly in which a printed-circuit board and a connector can be fixed positionally accurately in relation to one another by means of a position holder, wherein:

said position holder comprises soldering pins and said printed-circuit board has soldering pads provided on it which can be connected to the opposing soldering pins by soldering;

said soldering pins are latchably connectable with the connector at different heights.

10. The assembly described in claim 9, wherein:

said soldering pins have several space latching elements.

11. The assembly described in claim 9 wherein:

said connector has latching holes and said soldering pins (36, 27) are engageable with said latching.

12. A connector assembly which includes a circuit board with a plurality of tail-engaging traces, and a component with a plurality of tails that are each soldered to on of said tail engaging traces and with a body that is mounted in said circuit board, wherein:

said circuit board has a plurality of spaced solder pads; and including a plurality of spaced pins each having an upper end fixed to said body and having a lower face that is soldered to one of said plurality of solder pads on said circuit board.

13. The connection assembly described in claim 12 wherein:

said body has a plurality of holes, and the upper end of each of said pins lies in one of said holes.

\* \* \* \* \*